United States Patent
Hur et al.

(10) Patent No.: US 8,852,520 B2
(45) Date of Patent: Oct. 7, 2014

(54) PLASMA REACTOR FOR ABATING HAZARDOUS MATERIALS AND DRIVING METHOD THEREOF

(75) Inventors: Min Hur, Daejeon (KR); Min-Suk Cha, Daejeon (KR); Young-Hoon Song, Daejeon (KR); Jae-Ok Lee, Daejeon (KR); Dae-Hoon Lee, Daejeon (KR); Kwan-Tae Kim, Daegeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 430 days.

(21) Appl. No.: 12/905,227

(22) Filed: Oct. 15, 2010

(65) Prior Publication Data
US 2011/0089017 A1    Apr. 21, 2011

(30) Foreign Application Priority Data

Oct. 16, 2009    (KR) .................. 10-2009-0098892
Sep. 16, 2010    (KR) .................. 10-2010-0091074

(51) Int. Cl.
*B01J 19/08*    (2006.01)
*H01J 37/32*    (2006.01)
*B01D 53/32*    (2006.01)
*H05H 1/24*    (2006.01)

(52) U.S. Cl.
CPC ...... *H01J 37/3255* (2013.01); *H05H 2245/121* (2013.01); *B01D 2258/0216* (2013.01);
(Continued)

(58) Field of Classification Search
CPC ..................... H01J 37/3255; H01J 37/32541
USPC ................. 204/164, 157.15, 157.3; 422/186, 422/186.03
See application file for complete search history.

(56) References Cited

U.S. PATENT DOCUMENTS

2003/0007910 A1    1/2003    Diamant Lazarovich et al.
2004/0251411 A1 *  12/2004   Bateman et al. ............. 250/293
(Continued)

FOREIGN PATENT DOCUMENTS

CN    101022074    8/2007
JP    02-026804 A  1/1990
(Continued)

OTHER PUBLICATIONS

Min Hur et al, "AC driven low pressure plasma reactor with annular shaped electrodes for abatement of pollutants emitted from semiconductor processing", PLASMA SCIENCE, 2010 ABSTRACTS IEEE, XP031721970, ISBN: 978-1-4244-5474-7, 2010, IEEE.

(Continued)

*Primary Examiner* — Xiuyu Tai
(74) *Attorney, Agent, or Firm* — Pearl Cohen Zedek Latzer Baratz LLP (57) ABSTRACT

The present invention provides a plasma reactor for abating hazardous materials generated in a low-pressure process during a process of manufacturing a display or a semiconductor. A plasma reactor for abating hazardous materials according to an exemplary embodiment of the present invention includes: a first ground electrode and a second ground electrode disposed at a distance from each other; a dielectric fixed between the first ground electrode and the second ground electrode; and at least one driving electrode disposed on an outer surface of the dielectric, being spaced apart from the first ground electrode and the second ground electrode and connected to an AC power supply unit to receive a driving voltage therefrom.

12 Claims, 8 Drawing Sheets

(52) U.S. Cl.
CPC ........... *H01J 37/32541* (2013.01); *B01D 53/32* (2013.01); *H01J 37/32844* (2013.01); *H01J 37/32834* (2013.01); *H05H 2001/2456* (2013.01); *B01D 53/323* (2013.01); *H05H 1/2406* (2013.01); *B01D 2257/708* (2013.01); *B01D 2257/20* (2013.01); *H05H 2001/2462* (2013.01); *B01D 2257/2066* (2013.01); *B01D 2259/818* (2013.01); *H05H 2245/1215* (2013.01); *H01J 37/32091* (2013.01); *B01D 2257/40* (2013.01); *H01J 37/32348* (2013.01)
USPC .................... 422/186; 204/157.15; 204/157.3; 204/164; 422/186.03

(56) References Cited

U.S. PATENT DOCUMENTS

| | | | |
|---|---|---|---|
| 2005/0214181 A1 | 9/2005 | Kaneko et al. | |
| 2009/0031785 A1* | 2/2009 | Kellner et al. | ............... 73/23.39 |
| 2010/0019139 A1* | 1/2010 | Marta et al. | ................... 250/281 |

FOREIGN PATENT DOCUMENTS

| | | | |
|---|---|---|---|
| JP | 04-334543 | | 11/1992 |
| JP | 05-106053 | * | 4/1993 |
| JP | 2004-014699 A | | 1/2004 |
| JP | 2004-022213 A | | 1/2004 |
| JP | 2004-223365 | | 8/2004 |
| JP | 2004-305841 A | | 11/2004 |
| JP | 2004-323280 A | | 11/2004 |
| WO | WO 99/26726 A1 | | 6/1999 |
| WO | WO 2005-000450 | | 1/2005 |
| WO | WO 2005/074333 | * | 8/2005 |

OTHER PUBLICATIONS

Min Hur et al: "AC Low-pressure Plasmas Generated by Using Annular-shaped Electrodes for Abatement of Pollutants Emitted during Semiconductor Manufacturing Processes," Journal of the Korean Physical Society, vol. 59, No. 4, Oct. 2011, pp. 2742-2749.

European Search Report for European Application No. 10013598.7, dated May 26, 2014.

* cited by examiner

PLASMA REACTOR FOR ABATING HAZARDOUS MATERIALS AND DRIVING METHOD THEREOF

CROSS-REFERENCE TO RELATED APPLICATION

This application claims priority to and the benefit of Korean Patent Application Nos. 10-2009-0098892 and 10-2010-0091074 filed in the Korean Intellectual Property Office on Oct. 16, 2009 and Sep. 16, 2010, the entire contents of which are incorporated herein by reference.

FIELD OF THE INVENTION

The present invention relates to a plasma reactor for abating hazardous materials, and more particularly, to a plasma reactor for abating hazardous materials generated during a low-pressure process chamber among processes for manufacturing a display or a semiconductor.

BACKGROUND OF THE INVENTION

Among processing for manufacturing a display or a semiconductor, ashing, etching, depositing, cleaning, nitriding processes, or the like, are performed in a low-pressure process chamber. As gas used in the low-pressure process, there are (1) volatile organic compound (trichloroethylene, 1,1,1-trichloroethane, methanol, acetaldehyde, or the like), (2) acids ($HNO_3$, $H_2SO_4$, HCl, $F_2$, HF, $Cl_2$, $BCl_3$, NOx, or the like), (3) odor producing materials ($NH_3$, $H_2S$, or the like), (4) spontaneous combustion gas ($SiH_4$, $Si_2H_6$, $PH_3$, $AsH_3$, or the like), (5) global warming producing material (perfluoro compound), or the like.

Hazardous materials, or the like, such as fine particles, HF, fluoro compound, chloride, $SiO_2$, $GeO_2$, metal, NOx, $NH_3$, hydrocarbon, and perfluoro compound, are produced by the above-mentioned low-pressure process.

Among others, HF, fluoride, and chloride corrode a vacuum pump or a joint pipe (a pipe connecting a low pressure process chamber to a vacuum pump) and therefore, are hazardous materials that should be essentially treated before being discharged in the air. The fine particles, $SiO_2$, $GeO_2$, metal, etc., are changed into a powder type by subjecting to a cooling process while passing through the joint pipe. The powder is a factor shortening a lifespan of the vacuum pump. The discharge of the perfluoro compound in the air should be controlled by environmental regulations.

Therefore, the hazardous materials generated in the low-pressure process chamber are abated by installing a plasma reactor in front of the vacuum pump (that is, joint pipe). The plasma reactor generating the low pressure plasma installed in the front of the vacuum pump mainly uses an electrode structure in an inductive coupled plasma method and a radio frequency (RF) driving method.

The inductive coupled plasma method generates plasma by applying voltage across an electrode having a coil shape. However, since the plasma reactor is expensive, in particular, a radio frequency (RF) power supplier is very expensive, and power consumption for maintaining plasma is large, installation costs and maintenance costs are very high.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a plasma reactor for abating hazardous materials installed in front of a vacuum pump to generate low-pressure plasma having advantages of increasing treatment efficiency of hazardous materials while reducing installation costs and maintenance costs, doing stable operation for a long period of time, and reducing reactive power of a power supplier.

An exemplary embodiment of the present invention provides a plasma reactor for abating hazardous materials disposed a low-pressure process chamber and a vacuum pump and generating low-pressure plasma to abate hazardous materials generated in the low-pressure process chamber, including: a first ground electrode and a second ground electrode disposed at a distance from each other; a dielectric fixed between the first ground electrode and the second ground electrode; and at least one driving electrode disposed on an outer surface of the dielectric, being spaced apart from the first ground electrode and the second ground electrode and connected to an AC power supply unit to receive a driving voltage therefrom.

The first ground electrode, the dielectric, and the second ground electrode may be formed in a ring shape and may be connected in one direction to form a pipe. Any one of the first ground electrode and the second ground electrode may be connected to the low-pressure process chamber and the other may be connected to the vacuum pump.

The plasma reactor for abating hazardous materials may further include at least one auxiliary ground electrode disposed on the outer surface of the dielectric at a distance from the driving electrode.

The auxiliary ground electrode, the driving electrode, and the auxiliary ground electrode may be disposed along a longitudinal direction of the dielectric in order.

The driving electrode, the auxiliary ground electrode, and the driving electrode may be disposed along the longitudinal direction of the dielectric in order. A plurality of driving electrodes and a plurality of auxiliary ground electrodes may be alternately disposed one by one along the longitudinal direction of the dielectric.

Another exemplary embodiment of the present invention provides a method for driving a plasma reactor for abating hazardous materials including a dielectric, a first ground electrode and a second ground electrode fixed at both sides of the dielectric, and at least one driving electrode disposed on an outer surface of the dielectric at a distance from the first ground electrode and the second ground electrode, the method including: applying an AC driving voltage having a frequency of 1 kHz to 999 kHz to the driving electrode to generated low-pressure plasma.

The driving voltage may have a rising part, a sustain part, and an erase part and a positive voltage value and a negative voltage value may be periodically changed for one period.

The temperature and density of the low-pressure plasma may be changed by controlling the input power of the driving electrode, and the increase in input power may be implemented by any one of a method for increasing the driving voltage, a method for increasing the driving frequency, and a method for increasing a slope of the driving voltage.

Yet another exemplary embodiment of the present invention provides a method for driving a plasma reactor for abating hazardous materials including a dielectric, a first ground electrode and a second ground electrode fixed at both sides of the dielectric, and at least one driving electrode and at least one auxiliary ground electrode disposed on an outer surface of the dielectric at a distance from the first ground electrode and the second ground electrode, the method including: applying an AC driving voltage having a frequency of 1 kHz to 999 kHz to the driving electrode to generated low-pressure plasma.

The driving voltage may have a rising part, a sustain part, and an erase part and a positive voltage value and a negative voltage value may be periodically changed for one period.

The temperature and density of the low-pressure plasma may be changed by controlling the input power of the driving electrode, and the increase in input power may be implemented by any one of a method for increasing the driving voltage, a method for increasing the driving frequency, and a method for increasing a slope of the driving voltage.

Still another exemplary embodiment of the present invention provides a plasma reactor for abating hazardous materials, including: a first ground electrode and a second ground electrode disposed at a distance from each other; a first driving electrode disposed in the inside of the first ground electrode, having a first dielectric area therebetween and receiving a first AC voltage; and a second driving electrode disposed to be spaced apart from the first driving electrode, having a second dielectric area therebetween and disposed in the inside of the second ground electrode, having a third dielectric area therebetween and receiving a second AC voltage. The first AC voltage and the second AC voltage may have a phase difference of 180° and an amplitude of the first AC voltage and the second AC voltage may have a half value of an amplitude of a discharge driving voltage.

The discharge driving voltage may have the same phase as any one of the first AC voltage and the second AC voltage.

Still yet another exemplary embodiment of the present invention provides a plasma reactor for abating hazardous materials disposed a low-pressure process chamber and a vacuum pump and generating low-pressure plasma to abate hazardous materials generated in the low-pressure process chamber, including: a dielectric forming an inner space; a first ground electrode and a second ground electrode fixed at both ends of the dielectric; and a first driving electrode and a second driving electrode fixed at an outer surface of the dielectric, being spaced apart from the first ground electrode and the second ground electrode and connected to AC power supply units for the first driving electrode and the second driving electrode, respectively, to receive a first AC voltage and a second AC voltage, respectively. The first AC voltage and the second AC voltage may have a phase difference of 180° and an amplitude of the first AC voltage and the second AC voltage may have a half value of an amplitude of a discharge driving voltage.

The first ground electrode, the dielectric, and the second ground electrode may be formed in a ring shape and may be connected in one direction to form a pipe. Any one of the first ground electrode and the second ground electrode may be connected to the low-pressure process chamber and the other may be connected to the vacuum pump.

The discharge driving voltage may have the same phase as any one of the first AC voltage and the second AC voltage. The plasma reactor for abating hazardous materials may further include at least one driving electrode disposed between the first driving electrode and the second driving electrode and at least two ground electrodes.

At least one driving electrode may be a third driving electrode, and at least two ground electrodes may include a third ground electrode disposed between the first driving electrode and the third driving electrode and a fourth ground electrode disposed between the second driving electrode and the third driving electrode. The third driving electrode may receive the discharge driving voltage.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
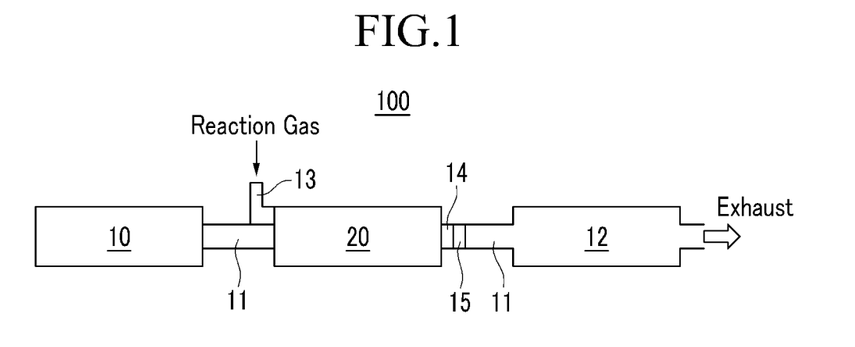
FIG. 1 is a configuration diagram of a low-voltage process system including a plasma reactor.

FIG. 1 is a configuration diagram of a low-voltage process system including a plasma reactor. The low-pressure process system of FIG. 1 may be applied to a process for manufacturing a display or a semiconductor.

Referring to FIG. 1, the low pressure process system 100 includes a low pressure process chamber 10, a vacuum pump 12 connected to the low pressure process chamber 10 through a joint pipe 11, and a plasma reactor 20 mounted in the joint pipe 11. The plasma reactor 20 is installed in front of the vacuum pump 12 and the inside thereof maintains a low pressure state similar to the low pressure process chamber 10. A reaction gas injection part 13 is disposed in front of the plasma reactor 20 and a scrubber 14 and a filter 15 are disposed at the back of the plasma reactor 20. A range of the low pressure is in 0.01 Torr to 10 Torr.

In the low-pressure process chamber 10, ashing, etching, depositing, cleaning, nitriding processes, or the like, are performed. Various hazardous materials such as hazardous gas, powder material, and perfluoro compound, are generated by the processes.

The plasma reactor 20 generates low pressure and high temperature plasma therein to decompose hazardous gas and perfluoro compound. The decomposed components combine with the reaction gases and are changed into harmless elements. The plasma richly includes reactant such as electrons or excited atoms, which promotes chemical reaction between the decomposed gas and the reaction gas.

The scrubber 14 neutralizes acid-based gas to increase the performance of the vacuum pump 12. The powder material is vaporized by high-temperature of the plasma to be discharged in the air without being accumulated in the vacuum pump 12, thereby increasing the lifespan of the vacuum pump 12. In this case, some of the powder materials may remain without being vaporized. A filter 15 filters powder materials, which are not vaporized, not to be introduced into the vacuum pump 12.

The plasma reactor according to the exemplary embodiments described below generates plasma in a dielectric barrier discharge manner, has an electrode structure in a ring shape, and has AC frequency driving characteristics of several kHz to several hundreds kHz. The above-mentioned characteristics increase the treatment efficiency of the hazardous materials and perform the stable operation for a long period of time while reducing the installation costs and maintenance costs of the plasma reactor. The detailed structure and operation of the plasma reactor will be described with reference to FIGS. 2 to 15.

Figure 2:
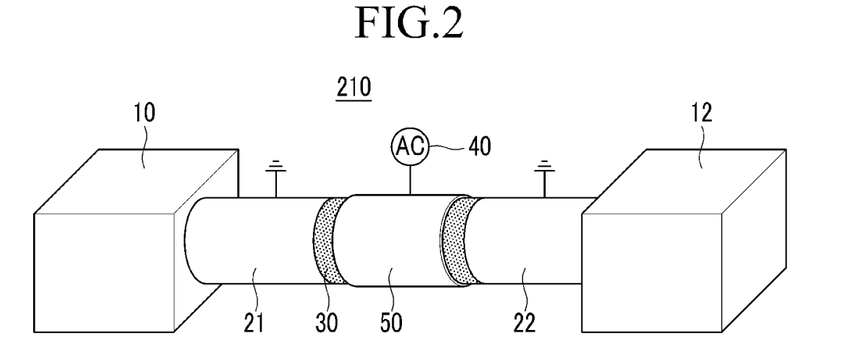
FIG. 2 is a perspective view of a plasma reactor according to a first exemplary embodiment of the present invention.
Figure 3:
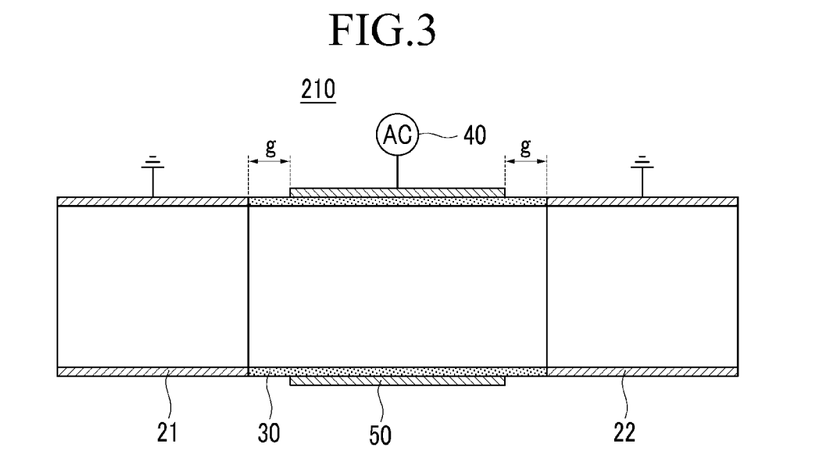
FIG. 3 is a cross-sectional view of the plasma reactor shown in FIG. 2.

FIG. 2 is a perspective view of a plasma reactor according to a first exemplary embodiment of the present invention and FIG. 3 is a cross-sectional view of a plasma reactor shown in FIG. 2.

Referring to FIGS. 2 and 3, a plasma reactor 210 according to the first exemplary embodiment includes a first ground electrode 21 and a second ground electrode 22 disposed at a distance from each other, a dielectric 30 fixed between the first ground electrode 21 and the second ground electrode 22, and a driving electrode 50 disposed at an outer surface of the dielectric 30 and connected to an AC power supply unit 40.

The first and second ground electrodes 21 and 22 are formed in a ring shape and are manufactured of a metal (for example, stainless steel). Any one of the first and second ground electrodes 21 and 22 may be a joint pipe connected to the low pressure process chamber 10 and the other may be a join pipe connected to the vacuum pump 12. In this case, the first and second ground electrodes 21 and 22 may be easily manufactured by a method of separating the existing join pipe and grounding the separated joint pipe without manufacturing a separate ground electrode.

The dielectric 30 is formed in a ring shape having the same diameter and sectional shape as the first and second ground electrodes 21 and 22. The dielectric 30 is fixed between the first and second ground electrodes 21 and 22 and connects two ground electrodes 21 and 22. Thereby, the first ground electrode 21, the dielectric 30, and the second ground electrode 22 that are connected in one direction configures a pipe, thereby connecting the low pressure process chamber 10 to the vacuum pump 12. The dielectric 30 may be made of ceramic or quartz.

The driving electrode 50 is formed to have a width smaller than the dielectric 30 to maintain a predetermined gap from the first and second ground electrodes 21 and 22. In particular, the driving electrode 50 may maintain the same gap g (see FIG. 3) as the first and second ground electrodes 21 and 22 by being positioned at the center of the outer surface of the dielectric 30. The driving electrode 50 is also formed in a ring shape surrounding the dielectric 30 and is connected to the AC power supply unit 40, thereby receiving the driving voltage necessary for the plasma discharge therefrom.

Figure 4A:
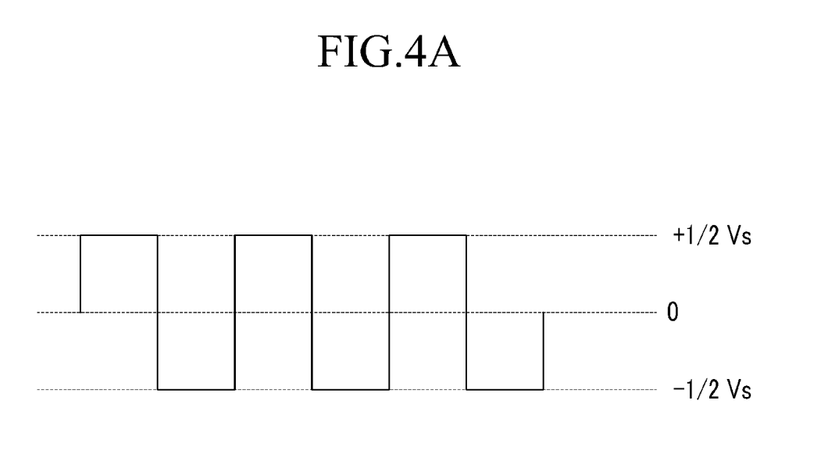
FIGS. 4A and 4B show an example showing a waveform of a driving voltage applied to a driving electrode in the plasma reactor shown in FIG. 2.
Figure 4B:
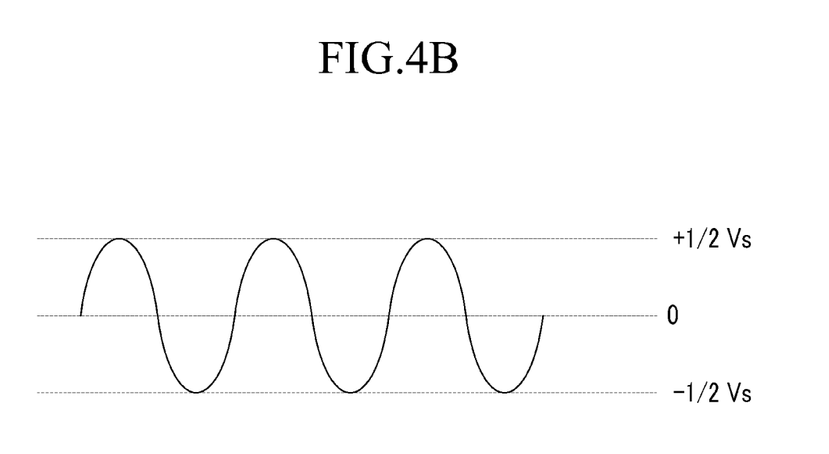

FIGS. 4A and 4B show an example showing a waveform of a driving voltage applied to a driving electrode in the plasma reactor shown in FIG. 2.

Referring to FIGS. 4A and 4B, a driving voltage Vs applied to the driving electrode 50 is AC voltage or bipolar pulse voltage having 1 KHz to 999 KHz and the operating voltage has a type in which a positive value ½ Vs and a negative voltage −½ Vs are periodically changed. The driving waveform has various shapes such as a square waveform, a triangle waveform, and a sine waveform and commonly has a rising part, a sustain part, and a erase part. FIGS. 4A and 4B each show an example of a square waveform and a sine waveform.

Referring back to FIGS. 2 and 3, when a driving voltage is applied to the driving electrode 50 in the plasma reactor 210 having the above-mentioned structure, the plasma discharge is induced into the inside of the plasma reactor 210 by the difference in voltage between the driving electrode 50 and the ground electrodes 21 and 22. The discharge is generated when the operating voltage is higher than a breakdown voltage of internal gas and the discharge current is continuously increased over time and then, reduced with the increased amount of wall charge accumulated on the dielectric 30.

That is, the plasma reactor 210 according to the first exemplary embodiment has a structure in which the dielectric exists between the ground electrodes 21 and 22 and the driving electrode 50 and therefore, the spatial charges in the plasma are accumulated on the dielectric 30 to generate wall charges as the discharge current is increased after the discharge starts. The wall charges serve to suppress voltage applied from the outside and the discharge becomes weak over time by the wall voltage of the dielectric 30. The plasma discharge repeats the generation, sustain, and erase processes while the applied voltage is maintained.

Therefore, the discharge is not transited to arc in the plasma reactor 210 according to the first exemplary embodiment and removes hazardous materials generated in the low pressure process chamber 10 while staying in the glow area. When the discharge is transited into the arc, the discharge is concentrated in the narrow area, which causes the damage of the electrode. However, the plasma reactor 210 according to the first exemplary embodiment uses the wall charges of the dielectric 30 to prevent the discharge from being transited to the arc, thereby making it possible to expand the lifespan of the driving electrode 50 and the ground electrodes 21 and 22.

In addition, the existing joint pipe is used as the ground electrodes 21 and 22, such that the plasma reactor 210 may be easily installed in the low voltage process system 100. Since the driving electrode 50 is disposed at the outside of the apparatus, that is, the outer surface of the dielectric 30, the shape of the driving electrode 50 or the gap between the ground electrodes 21 and 22 may be freely controlled without stopping the operation of the vacuum pump 12 and the driving electrode 50 may be easily replaced.

In addition, since the ground electrodes 21 and 22 and the driving electrode 50 are formed in a ring shape, the uniformity of the plasma is increased and the driving electrode 50 is formed to have a sufficient width, thereby making it possible to increase the residual time in the plasma of the hazardous gas. The treatment efficiency of the hazardous materials is increased due to the increase in uniformity and residual time of plasma. In this case, the treatment efficiency is defined as "decomposition rate/power consumption" and a larger amount of hazardous materials can be treated under the same power consumption condition.

In the process of abating the hazardous gas using plasma, the plasma conditions for completely decomposing the hazardous gas may be changed according to the kind and amount of the hazardous gas. Factors largest affecting the hazardous gas decomposition may include the temperature and density of plasma.

In the plasma reactor 210 according to the first exemplary embodiment, the input power is changed by a method of increasing driving voltage or driving frequency or increasing the gradient of the driving voltage as the decomposition of the hazardous gas is difficult or the amount of hazardous gas is increased, thereby increasing the temperature and density of plasma. Therefore, the hazardous gas is completely decomposed even in various operational environments, thereby making it possible to improve the abating performance.

Figure 5:
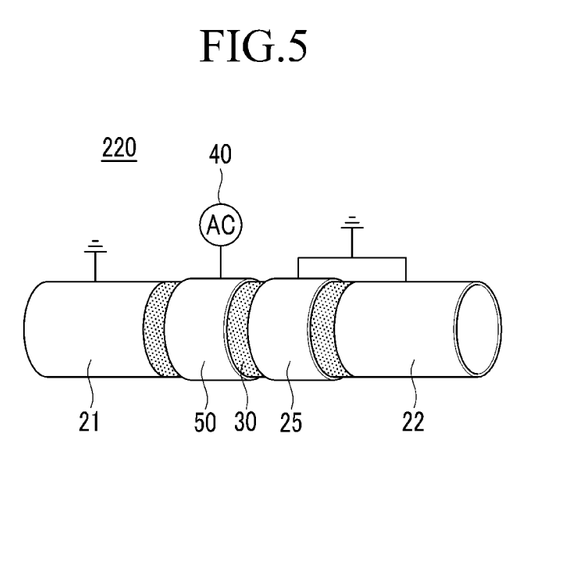
FIG. 5 is a perspective view of a plasma reactor according to a second exemplary embodiment of the present invention.

FIG. 5 is a perspective view of a plasma reactor according to a second exemplary embodiment of the present invention.

Referring to FIG. 5, a plasma reactor 220 according to the second exemplary embodiment has the same components as the plasma reactor according to the first exemplary embodiment other than it further includes an auxiliary ground electrode 25 disposed at an outer surface of the dielectric surface 30 and disposed at a distance from the driving electrode 50. The same reference numerals refer to the same components as the first exemplary embodiment.

Figure 6:
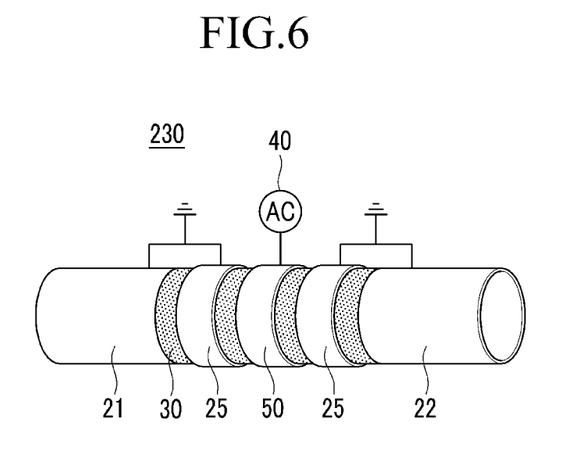
FIG. 6 is a perspective view of a plasma reactor according to a third exemplary embodiment of the present invention.

FIG. 6 is a perspective view of a plasma reactor according to a third exemplary embodiment of the present invention.

Referring to FIG. 6, a plasma reactor 230 according to the third exemplary embodiment has the same components as the plasma reactor according to the second exemplary embodiment other than one driving electrode 50 is disposed between two auxiliary ground electrodes 25, being spaced apart therefrom. The same reference numerals refer to the same components as the second exemplary embodiment.

Figure 7:
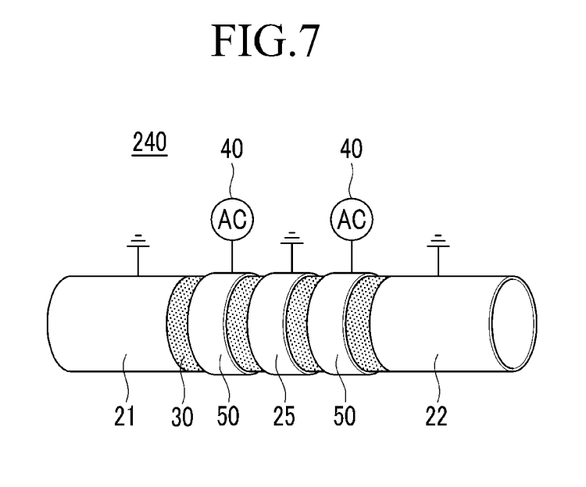
FIG. 7 is a perspective view of a plasma reactor according to a fourth exemplary embodiment of the present invention.

FIG. 7 is a perspective view of a plasma reactor according to a fourth exemplary embodiment of the present invention.

Referring to FIG. 7, a plasma reactor 240 according to the fourth exemplary embodiment has the same components as the plasma reactor according to the second exemplary embodiment other than one auxiliary ground electrode 25 is disposed between two driving electrodes 50, being spaced apart therefrom. The same reference numerals refer to the same components as the second exemplary embodiment.

Figure 8:
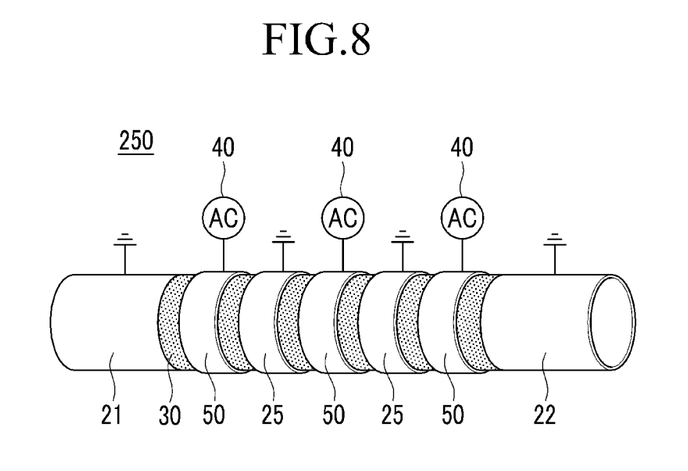
FIG. 8 is a perspective view of a plasma reactor according to a fifth exemplary embodiment of the present invention.

FIG. 8 is a perspective view of a plasma reactor according to a fifth exemplary embodiment of the present invention.

Referring to FIG. 8, a plasma reactor 250 according to the fifth exemplary embodiment has the same components as the plasma reactor according to the second exemplary embodiment other than two or more driving electrodes 50 and two or more auxiliary ground electrode 25 are alternately disposed one by one at a distance from each other. The same reference numerals refer to the same components as the second exemplary embodiment.

In the second exemplary embodiment to the fifth exemplary embodiment, at least one driving electrode 50 and at least one auxiliary ground electrode 25 are disposed on an outer surface of the dielectric 30 at a distance from each other. The auxiliary ground electrode 25 is also formed in the same ring shape as the driving electrode 50. In this structure, the residual time in the plasma of hazardous gas may be increased with the increased length of plasma and the amount of wall charges is uniform to increase the stability of discharge.

That is, in the structure in which only one driving electrode 50 is disposed at the outer surface of the dielectric 30, when the area of the driving electrode 50 is excessive, the time when the wall charge is accumulated is delayed, such that the wall charge may sufficiently not be accumulated before the polarity of the driving electrode 50 is changed. The insufficient accumulation of the wall charge may be caused the rising of the driving voltage as well as the instability of the discharge may be caused by the positive non-uniformity of the wall charge.

However, in the structure in which the width of the driving electrode 50 is reduced and the auxiliary ground electrode 25 is disposed between the driving electrode 50, the amount of the wall charge is uniform, thereby making it possible to remove the instability of the discharge and increase the treatment efficiency of the hazardous materials.

In addition, the plasma reactors 210, 220, 230, 240, and 250 according to the first to fifth exemplary embodiments apply the AC driving manner without using a radio frequency, thereby saving the initial installation costs and being relatively free in the impedance matching, thereby largely improving the stability of discharge against the radio frequency manner.

Figure 9:
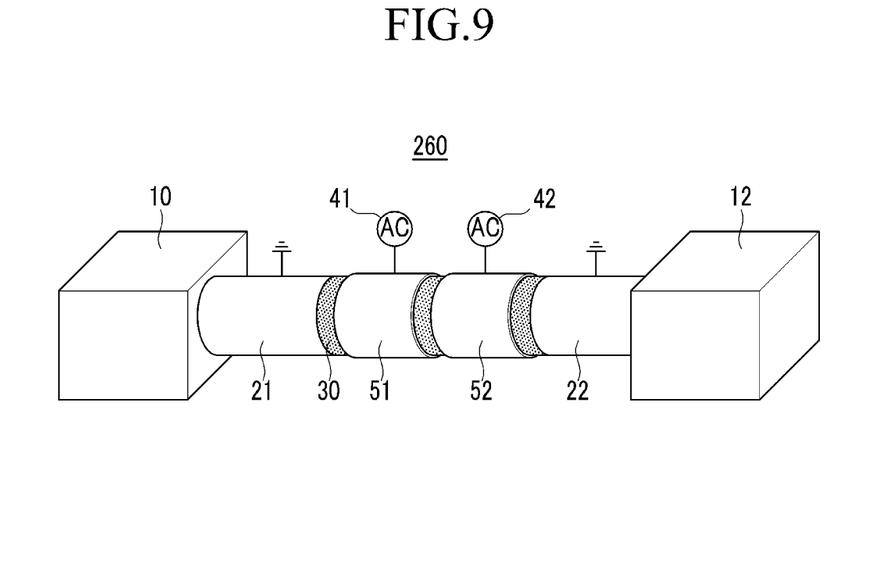
FIG. 9 is a perspective view of a plasma reactor according to a sixth exemplary embodiment of the present invention.
Figure 10:
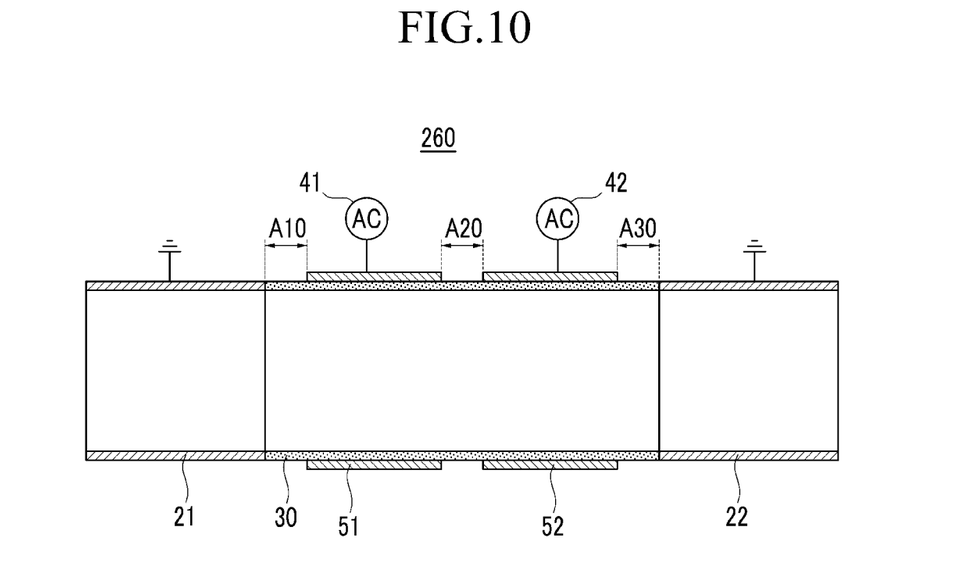
FIG. 10 is a cross-sectional view of the plasma reactor shown in FIG. 9.

FIG. 9 is a perspective view of a plasma reactor according to a sixth exemplary embodiment of the present invention and FIG. 10 is a cross-sectional view of a plasma reactor shown in FIG. 9.

Referring to FIGS. 9 and 10, a plasma reactor 260 according to the sixth exemplary embodiment includes a dielectric 30, first and second ground electrodes 21 and 22 fixed to both ends of the dielectric 30, and first and second driving electrodes 51 and 52 fixed on the outer surface of the dielectric 30. The first driving electrode 51 is connected to the first AC power supply unit 41 and the second driving electrode 52 is connected to the second AC power supply unit 42.

The first and second driving electrodes 51 and 52 are formed in a ring shape surrounding the dielectric 30 and receive the first AC voltage and the second AC voltage necessary to generate plasma from the first and second AC power supply units 41 and 42, respectively. The first driving electrode 51 maintains the first ground electrode 21 and the second driving electrode 52 at a predetermined distance and the second driving electrode 52 maintains the second ground electrode 22 at a predetermined distance.

The dielectric 30 includes a first dielectric area A10 disposed between the first ground electrode 21 and the first driving electrode 51, a second dielectric area A20 disposed between the first driving electrode 51 and the second driving electrode 52, and a third dielectric area A30 disposed between the second driving electrode 52 and the second ground electrode 22. The first to third dielectric areas A10, A20, and A30 may have the same width.

Figure 11:
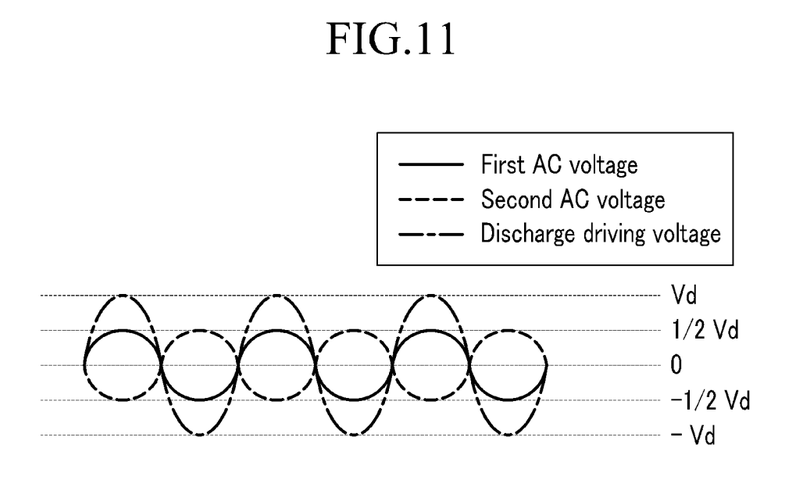
FIG. 11 is a diagram showing an example of waveforms of a first AC voltage and a second AC voltage applied to each of a first driving electrode and a second driving electrode in the plasma reactor shown in FIG. 9.

FIG. 11 is a diagram showing an example of waveforms of a first AC voltage and a second AC voltage applied to each of a first driving electrode and a second driving electrode in the plasma reactor shown in FIG. 9.

Referring to FIG. 11, the first AC voltage and the second AC voltage have a phase difference of 180° with respect to each other and alternately receive a positive voltage and a negative voltage at each period. The amplitude of the first and second AC voltage has a half value of the amplitude of the discharge driving voltage Vd. In this case, the "discharge driving voltage" starts discharge and is defined as the driving voltage maintaining it and may be variously set according to the shape condition of the plasma reactor and the state of the hazardous materials.

The first and second AC voltages have a frequency of 1 kHz to 999 kHz and may be formed in various types such as a sine waveform, a square waveform, and a triangle waveform. FIG. 11 shows, by way of example, the first and second AC voltages are a sine waveform.

Figure 12:
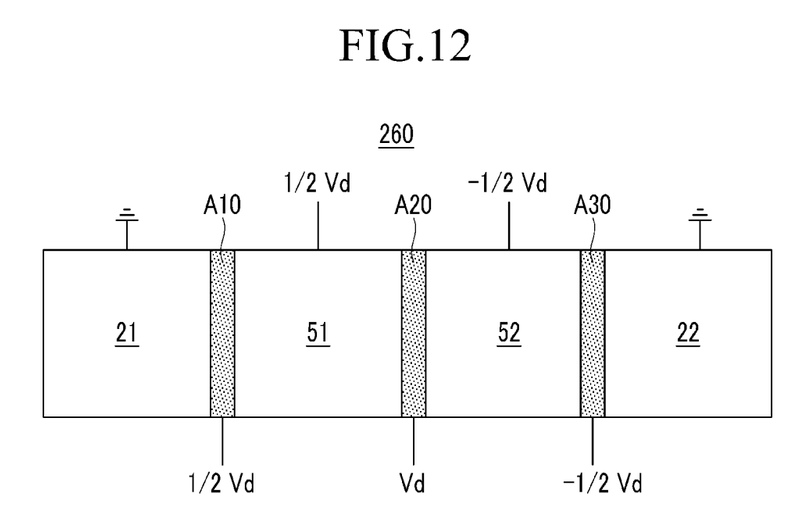
FIG. 12 is a schematic diagram of the plasma reactor shown in FIG. 9.

FIG. 12 is a schematic diagram of the plasma reactor shown in FIG. 9.

Referring to FIG. 12, when the first AC voltage and the second AC voltage are applied to each of the first driving electrode 51 and the second driving electrode 52, the plasma discharge is induced in the plasma reactor 260 by the voltage difference between the electrodes 21, 51, 52, and 22.

In detail, when the positive voltage ½ Vd is applied to the first driving electrode 51 and the negative voltage −½ Vd is applied to the second driving electrode 52, the voltage corresponding to the difference between the first AC voltage and the second AC voltage, that is, the voltage having the magnitude corresponding to the discharge driving voltage Vd is applied to the second dielectric area A20. The voltage ½ Vd having the same magnitude as the first AC voltage is applied to the first dielectric area A10 and the voltage −½ Vd having the same magnitude as the second AC voltage is applied to the third dielectric area A30.

In the plasma reactor 260 according to the sixth exemplary embodiment, the voltage applied to the second dielectric area A20, that is, the discharge driving voltage Vd becomes the operating voltage. The discharge is generated when the operating voltage is higher than a breakdown voltage of internal gas and the discharge current is continuously increased over time and then, reduced with the increased amount of wall charge accumulated on the dielectric 30.

That is, as the discharge current is increased after the discharge starts, the spatial charges in the plasma are accumulated on the discharge material 30 to generate the wall charge. The wall charges serve to suppress voltage applied from the outside and the discharge becomes weak over time by the wall voltage of the dielectric 30. The plasma discharge repeats the generating, sustain, and erasing processes while the applied voltage is maintained.

In this case, as the first AC voltage and the second AC voltage have the half amplitude to the discharge driving voltage Vd while having the phase difference of 180° from each other, the plasma reactor 260 may effectively lower the reactive power consumed in the AC power supply circuit.

The entire reactive power of the AC power supply circuit is a value obtained by summing each reactive power of each of the first to third dielectric areas A10, A20, and A30. The reactive power of each of the dielectric areas A10, A20, and A30 is in proportional to the capacitance and driving frequency of the dielectric 30 and is in proportional to a square of the voltage applied to the corresponding dielectric areas A10, A20, and A30. In the first to third dielectric areas A10, A20, and A30, the capacitance and driving frequency of the dielectric 30 are the same and thus, the reactive power is in proportional to a square of the voltage applied to each of the dielectric areas A10, A20, and A30.

If it is assumed that the case where the same discharge driving voltage Vd is applied to all the first to third dielectric areas A10, A20, and A30 is a first comparative example, the voltage applied to the first and third dielectric areas A10, and A30 is a half of the discharge driving voltage Vd and thus, the reactive power of the first and third dielectric areas A10 and A30 is reduced to ¼ as compared to the first comparative example. Therefore, the entire reactive power of the AC power supply circuit is reduced to a half as compared to the first comparative example.

The power consumption of the AC power supply circuit is a sum of the effective power that is a power consumed in the discharging and the reactive power that is not consumed in the discharging. The plasma reactor 260 according to the sixth exemplary embodiment minimizes the reactive power as described above, thereby making it possible to effectively lower the power consumption necessary to abate the hazardous materials.

Figure 13:
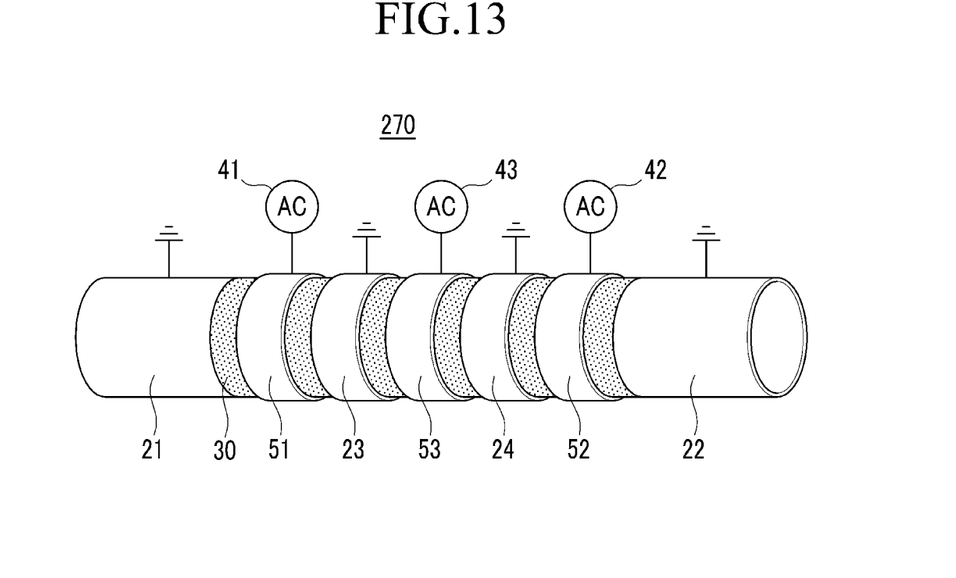
FIG. 13 is a perspective view of a plasma reactor according to a seventh exemplary embodiment of the present invention.
Figure 14:
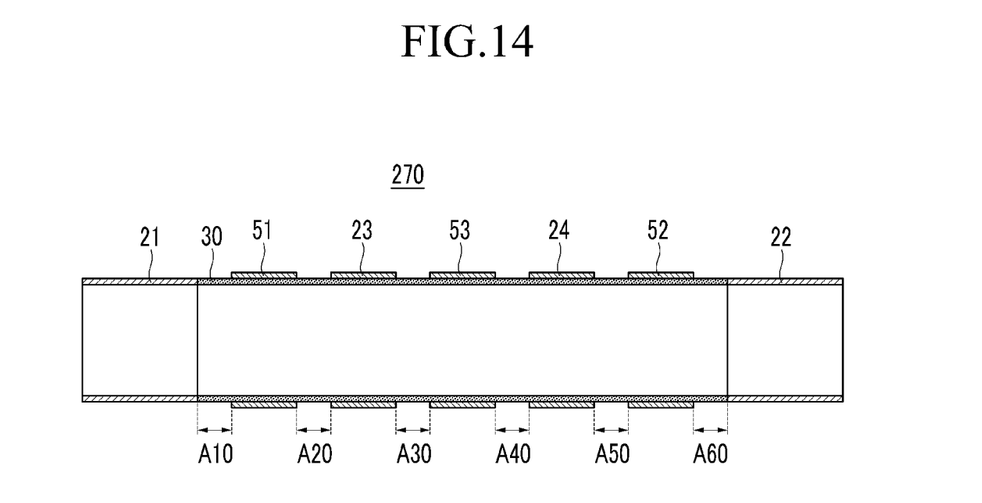
FIG. 14 is a cross-sectional view of the plasma reactor shown in FIG. 13.
Figure 15:
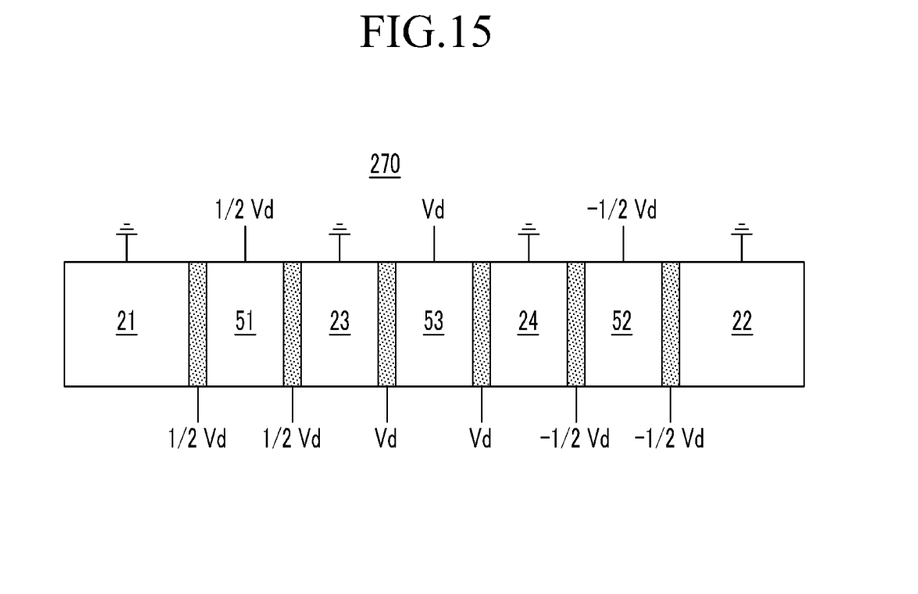
FIG. 15 is a cross-sectional view and a schematic diagram of the plasma reactor shown in FIG. 13.

FIG. 13 is a perspective view of a plasma reactor according to a seventh exemplary embodiment of the present invention and FIGS. 14 and 15 are a schematic view and a cross-sectional view of a plasma reactor shown in FIG. 13.

Referring to FIGS. 13 to 15, a plasma reactor 270 according to a seventh exemplary embodiment is similar to the plasma reactor according to the above-mentioned sixth exemplary embodiment other than it includes at least one driving electrode between the first driving electrode 51 and the second driving electrode 52 and at least two ground electrodes. The same reference numerals refer to the same components as the sixth exemplary embodiment and the detailed description of the same components as the sixth exemplary embodiment will be omitted.

A third driving electrode 53 is disposed between the first driving electrode 51 and the second driving electrode 52 and a third ground electrode 23 and a fourth ground electrode 24 may be disposed at both sides of the third driving electrode 53. The third driving electrode 53 maintains a predetermined distance from the third and fourth ground electrodes 23 and 24 and the third ground electrode 23 and the fourth ground electrode 24 each maintain a predetermined distance from the first driving electrode 51 and the second driving electrode 52.

The third driving electrode 53 is connected to the third AC power supply unit 43 to receive a third AC voltage. The third AC voltage is the same as the discharge driving voltage Vd shown in FIG. 11. In other words, the third AC voltage has the same phase as the first AC voltage and the amplitude of the third AC voltage is two times larger than the first AC voltage.

The dielectric 30 includes six dielectric areas A10, A20, A30, A40, A50, and A60. The first to sixth dielectric areas A10, A20, A30, A40, A50, and A60 are each disposed between the first ground electrode 21 and the first driving electrode 51, between the first driving electrode 51 and the third ground electrode 23, between the third ground electrode 23 and the third driving electrode 53, between the third driving electrode 53 and the fourth ground electrode 24, between the fourth ground electrode 24 and the second driving electrode 52, and between the second driving electrode 52 and the second ground electrode 22. The first to sixth dielectric areas A10, A20, A30, A40, A50, and A60 may have the same width.

In the operating process of the plasma reactor 270, the voltage having the same magnitude as the discharge driving voltage Vd is applied between the third and fourth dielectric areas A30 and A40. The voltage having the same magnitude as the first AC voltage ½ Vd is applied to the first and second dielectric areas A10 and A20 and the voltage having the same magnitude as the second AC voltage −½ Vd is applied to the fifth and sixth dielectric areas A50 and A60. In the plasma reactor 270 according to the seventh exemplary embodiment, the voltage applied to the third and fourth dielectric areas A30 and A40, that is, the discharge driving voltage Vd becomes the operating voltage.

If it is assumed that the case where the same discharge driving voltage Vd is applied to all the first to sixth dielectric areas A10, A20, A30, A40, A50, and A60 is a comparative example, the voltage that is applied to the first dielectric area A10, the second dielectric area A20, the fifth dielectric area A50, and the sixth dielectric area A60 is a half of the discharge driving voltage Vd, such that the reactive power of theses four dielectric areas A10, A20, A50, and A60 is reduced to ¼ as compared to the second comparative example. Therefore, the entire reactive power of the AC power supply circuit is reduced to a half as compared to the second comparative example.

The plasma reactor 270 according to the seventh exemplary embodiment increases the length of the plasma to increase the residual time in the plasma of hazardous materials, thereby making it possible to improve the abating efficiency of the hazardous gas. In addition, when the area of the driving electrode is excessive, the time when the wall charge is accumulated is delayed, such that the sufficient wall charge may sufficiently not be accumulated before the polarity of the driving electrode is changed. In the plasma reactor according to the seventh exemplary embodiment, as the width of the driving electrodes 51, 52, and 53 is small, the phenomenon that the wall charges is accumulated insufficiently is prevented, thereby making it possible to improve the stability of discharge.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma reactor for abating hazardous materials, being disposed between a low-pressure process chamber and a vacuum pump and generating low-pressure plasma to abate hazardous materials generated in the low-pressure process chamber, comprising:
    a first ground electrode and a second ground electrode disposed at a distance from each other;
    a dielectric fixed between the first ground electrode and the second ground electrode, and separating the first ground electrode and the second ground electrode; and
    at least one driving electrode disposed on an outer surface of the dielectric, being between the first ground electrode and the second ground electrode, spaced apart from the first ground electrode and the second ground electrode and connected to an AC power supply unit to receive a driving voltage therefrom;
    wherein the dielectric has the same diameter and sectional shape as the first ground electrode and the second ground electrode;
    wherein the first ground electrode, the dielectric and the second ground electrode are formed in a ring shape and are connected in one direction to form a pipe; and
    wherein any one of the first ground electrode and the second ground electrode is connected to the low-pressure process chamber and the other is connected to the vacuum pump.

2. The plasma reactor for abating hazardous materials of claim 1, further comprising:
    at least one auxiliary ground electrode disposed on the outer surface of the dielectric at a distance from the driving electrode.

3. The plasma reactor for abating hazardous materials of claim 2, wherein:
    the at least one auxiliary ground electrode comprises a first auxiliary ground electrode and a second auxiliary ground electrode; and
    the first auxiliary ground electrode, the driving electrode, and the second auxiliary ground electrode are disposed along a longitudinal direction of the dielectric in order.

4. The plasma reactor for abating hazardous materials of claim 2, wherein:
    the at least one driving electrode comprises a first driving electrode and a second driving electrode; and
    the first driving electrode, the at least one auxiliary ground electrode, and the second driving electrode are disposed along the longitudinal direction of the dielectric in order.

5. The plasma reactor for abating hazardous materials of claim 2, wherein:
    a plurality of driving electrodes and a plurality of auxiliary ground electrodes are alternately disposed one by one along the longitudinal direction of the dielectric.

6. A plasma reactor for abating hazardous materials, being disposed between a low-pressure process chamber and a vacuum pump and generating low-pressure plasma to abate hazardous material generated in the low-pressure process chamber, comprising:
    a first ground electrode and a second ground electrode disposed at a distance from each other;
    a dielectric fixed between the first ground electrode and the second ground electrode, and separating the first ground electrode and the second ground electrode;
    a first driving electrode disposed between the first ground electrode and the second ground electrode, having a first dielectric area between the first ground electrode and the first driving electrode, and receiving a first AC voltage; and
    a second driving electrode disposed between the first driving electrode and the second ground electrode, being spaced apart from the first driving electrode, having a second dielectric area between the second driving electrode and the second ground electrode, having a third dielectric area between the first driving electrode and the second driving electrode, and receiving a second AC voltage,
    wherein the dielectric has the same diameter and sectional shape as the first ground electrode and the second ground electrode;
    wherein the first ground electrode, the dielectric and the second ground electrode are formed in a ring shape and are connected in one direction to form a pipe;
    wherein the first AC voltage and the second AC voltage have a phase difference of 180°, and
    wherein an amplitude of the first AC voltage and the second AC voltage has a half value of an amplitude of a discharge driving voltage; and
    wherein any one of the first ground electrode and the second ground electrode is connected to the low-pressure process chamber and the other is connected to the vacuum pump.

7. The plasma reactor for abating hazardous materials of claim 6, wherein:
    the discharge driving voltage has the same phase as any one of the first AC voltage and the second AC voltage.

8. A plasma reactor for abating hazardous materials, being disposed between a low-pressure process chamber and a vacuum pump and generating low-pressure plasma to abate hazardous materials generated in the low-pressure process chamber, comprising:
    a dielectric forming an inner space;
    a first ground electrode and a second ground electrode fixed at both ends of the dielectric; and
    a first driving electrode and a second driving electrode fixed at an outer surface of the dielectric, being spaced apart from the first ground electrode and the second ground electrode and connected to AC power supply units for the first driving electrode and the second driving electrode, respectively, to receive a first AC voltage and a second AC voltage, respectively,
    wherein the dielectric has the same diameter and sectional shape as the first ground electrode and the second ground electrode,
    wherein the first ground electrode, the dielectric and the second ground electrode are formed in a ring shape and are connected in one direction to form a pipe, wherein the first AC voltage and the second AC voltage have a phase difference of 180°, wherein an amplitude of the first AC voltage and the second AC voltage has a half value of an amplitude of a discharge driving voltage; and wherein any one of the first ground electrode and the second ground electrode is connected to the low-pressure process chamber and the other is connected to the vacuum pump.

9. The plasma reactor for abating hazardous materials of claim 8, wherein:

the discharge driving voltage has the same phase as any one of the first AC voltage and the second AC voltage.

10. The plasma reactor for abating hazardous materials of claim 9, further comprising:

at least one driving electrode disposed between the first driving electrode and the second driving electrode and at least two ground electrodes.

11. The plasma reactor for abating hazardous materials of claim 10, wherein:

the at least one driving electrode is a third driving electrode, and the at least two ground electrodes include a third ground electrode disposed between the first driving electrode and the third driving electrode and a fourth ground electrode disposed between the second driving electrode and the third driving electrode.

12. The plasma reactor for abating hazardous materials of claim 11, wherein:

the third driving electrode receives the discharge driving voltage.

* * * * *